(12) United States Patent
Boyd et al.

(10) Patent No.: US 12,021,345 B1
(45) Date of Patent: Jun. 25, 2024

(54) FREQUENCY STANDARD IMMUNE TO LASER WAVELENGTH VARIATION AND AGING

(71) Applicant: Vector Atomic, Inc., Pleasanton, CA (US)

(72) Inventors: Martin Machai Boyd, Pleasanton, CA (US); Arman Cingoz, Pleasanton, CA (US); Abijith Sudarsan Kowligy, Livermore, CA (US); William David Lunden, Dublin, CA (US); Jonathan David Roslund, Pleasanton, CA (US)

(73) Assignee: Vector Atomic, Inc., Pleasanton, CA (US)

( * ) Notice: Subject to any disclaimer, the term of this patent is extended or adjusted under 35 U.S.C. 154(b) by 0 days.

(21) Appl. No.: 18/411,435

(22) Filed: Jan. 12, 2024

(51) Int. Cl.
*H01S 3/1109* (2023.01)
*G04F 5/14* (2006.01)
*H01S 3/13* (2006.01)

(52) U.S. Cl.
CPC .............. *H01S 3/1109* (2013.01); *G04F 5/14* (2013.01); *H01S 3/1303* (2013.01)

(58) Field of Classification Search
CPC ......... H01S 3/1303; H01S 3/1109; G04F 5/14
See application file for complete search history.

(56) References Cited

U.S. PATENT DOCUMENTS

| 11,619,861 | B1 * | 4/2023 | Cingoz | G02F 1/3558 |
| | | | | 359/328 |
| 2019/0131759 | A1 * | 5/2019 | Shirakawa | H01S 3/1392 |
| 2023/0344189 | A1 * | 10/2023 | Olson | H01S 3/1305 |

OTHER PUBLICATIONS

J. Hrabina et al., "Comparison of Molecular Iodine Spectral Properties at 514.7 and 532 nm Wavelengths," Measurement Science Review, 2014, 14 (4), pp. 213-218.
Kobayashi, Takumi, et al. "Compact iodine-stabilized laser operating at 531 nm with stability at the 10-12 level and using a coin-sized laser module." Optics express 23.16 (2015): 20749-20759.
Winkler, et al., "Artificial Neural Networks for Laser Frequency Stabilization", Optics Express, vol. 31, No. 20 / Sep. 25, 2023 / Optics Express 32188.

* cited by examiner

*Primary Examiner* — Michael Carter
(74) *Attorney, Agent, or Firm* — Patterson + Sheridan, LLP

(57) ABSTRACT

Embodiments herein describe peak detection techniques for selecting an absorption line to lock a spectroscopy laser in a frequency reference (e.g., an atomic clock). In one embodiment, an atomic reference is used which has many absorption lines within a relatively small frequency range (e.g., within a gain profile of the spectroscopy laser). The peak detection techniques can evaluate which of these lines a laser can be locked to. For example, the peak detection algorithm can define a preferred absorption line. But if for some reason the spectroscopy laser cannot be locked to the preferred absorption line, the peak detection technique has at least one backup absorption line. By having a set of candidate absorption lines, the peak detection algorithm can identify a suitable absorption line for lasers with different gain regions, or as gain regions change.

23 Claims, 9 Drawing Sheets

FREQUENCY STANDARD IMMUNE TO LASER WAVELENGTH VARIATION AND AGING

STATEMENT OF GOVERNMENT INTEREST

This invention was made with government support under contract HR001121C0175 awarded by the Defense Advanced Research Projects Agency. The government has certain rights in the invention.

BACKGROUND

Field

Embodiments of the present invention generally relate to detecting an absorption line to lock a laser to an atomic reference.

Description of the Related Art

Optical atomic clocks offer improved frequency instabilities compared to microwave frequency standards due to the higher quality factor Q associated with an optical resonance. To operate an optical clock, a high precision reference laser (also called a spectroscopy laser), is stabilized to the atomic or molecular transition in order to generate a stable optical reference frequency. Optical clocks use a frequency comb to convert the optical reference frequency into a high-precision electrical clock signal at microwave frequencies. For example, a beatnote is used between the spectroscopy laser and a frequency comb tooth to allow stabilization and user adjustment of the comb pulse repetition frequency (Frep), which is used as the output of the clock.

However, before locking the frequency comb to the spectroscopy laser, the system ensures the laser is set to a specific frequency by locking the laser to an atomic reference (e.g., a vapor cell containing an atom or molecule). That is, the spectroscopy laser is locked to an absorption line of the atom or molecule. However, atomic clocks that use a single absorption line require a laser operating at a specific wavelength for operation. Due to fabrication variations, a laser may not have a gain profile that includes the frequency corresponding to the absorption line, which prevents the laser from locking to the absorption line. Also, even if a laser has a gain profile that includes the absorption line when first made, aging may cause the gain profile to shift so it no longer includes the absorption line. Further, gain profiles may have mode hops. When the absorption line falls within a mode hop, the laser cannot lock to the absorption line. Finally, the temperature requirements for a given laser to reach the target absorption line may be prohibitive to other aspects of the system, such as the desired operating temperature of the atomic reference. These issues can reduce yield and device lifetimes.

SUMMARY

One embodiment described herein is a method that includes providing a preferred absorption line and at least one backup absorption line of an atomic reference, identifying a location of a spectroscopy laser on an absorption spectrum of the atomic reference, determining using a computing system, based on the location, whether a lasing mode of the spectroscopy laser can be moved to lock the spectroscopy laser to the preferred absorption line, and upon determining that the preferred absorption line is unavailable, locking the spectroscopy laser to the backup absorption line using a spectroscopy technique.

Another embodiment described herein is a system that includes a spectroscopy laser, an atomic reference, and a peak identification system configured to identify a location of the spectroscopy laser on an absorption spectrum of the atomic reference, determine, based on the location, whether a lasing mode of the spectroscopy laser can be moved to lock the spectroscopy laser to a preferred absorption line in the absorption spectrum, and upon determining that the preferred absorption line is unavailable, lock the spectroscopy laser to a backup absorption line in the absorption spectrum using a spectroscopy technique.

Another embodiment described herein is non-transitory computer-readable medium encoding instructions, which, when executed by a processor perform an operation. The operation comprising identifying a location of the spectroscopy laser on an absorption spectrum of the atomic reference, determining, based on the location, whether a lasing mode of the spectroscopy laser can be moved to lock the spectroscopy laser to a preferred absorption line in the absorption spectrum, and upon determining that the preferred absorption line is unavailable, locking the spectroscopy laser to a backup absorption line in the absorption spectrum using a spectroscopy technique.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
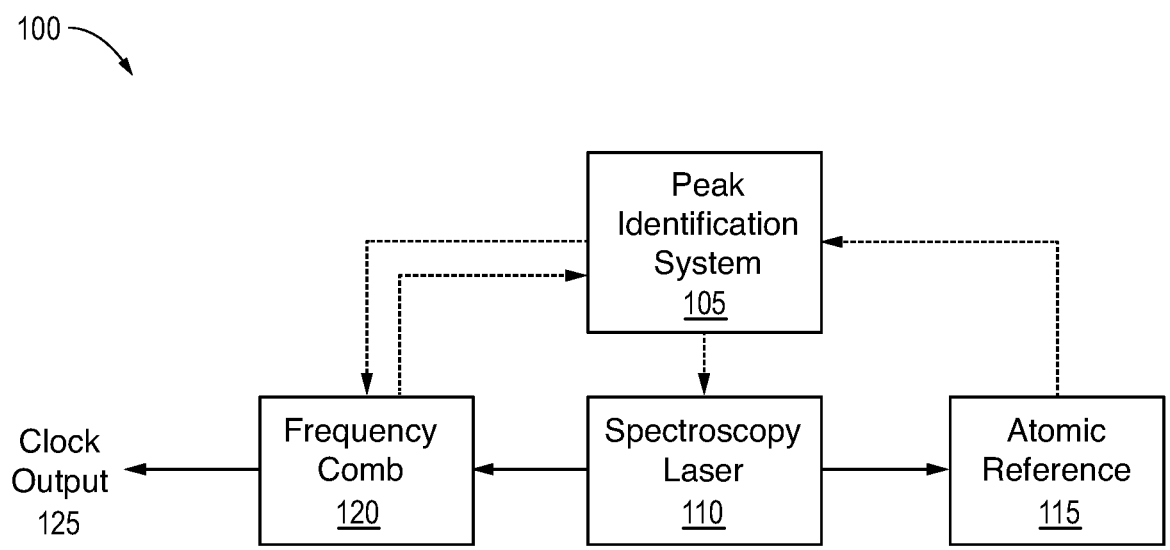
FIG. 1 illustrates a frequency standard with a peak identification system, according to one embodiment described herein.

Embodiments herein describe peak detection methods and algorithms for selecting an absorption line to lock a spectroscopy laser in a frequency standard system (e.g., an atomic clock). In one embodiment, a molecule (e.g., iodine, acetylene, methane, among others) is used as the atomic reference for locking the reference system, since a molecule can have many absorption lines within a relatively small frequency range (e.g., within a gain profile of the spectroscopy laser). A single atom reference source may have only one or two absorption lines within a gain profile of a spectroscopy laser. Since a molecule provides several absorption lines within (or near) a gain region of a laser, the peak detection algorithm can evaluate which of these lines a laser can be tuned to. For example, the peak detection algorithm can define a preferred (or target) absorption line. But if for some reason (e.g., due to fabrication variances, aging, mode hops, operating temperature etc.) the laser cannot be tuned to the frequency corresponding to the preferred absorption line, the peak detection algorithm has at least one backup absorption line of similar performance. A user (or an algorithm) can select absorption lines that are at different locations of the absorption spectrum (also called the spectra) of the molecule so no matter the gain region of the laser, the peak detection algorithm can identify and then tune the laser to match the frequency corresponding to the absorption line. Thus, by having a set (or list) of candidate absorption lines, the peak detection algorithm can identify a suitable absorption line for lasers with different gain regions, or as gain regions change. While the frequency of the resulting spectroscopy laser differs for alternate absorption lines, the frequency comb parameters can be adjusted to provide the target microwave output frequency.

One issue with evaluating multiple absorption lines is that a molecule can have multiple manifolds (e.g., groups of absorption lines) in its absorption spectrum. The peak detection algorithm may not know exactly where the laser is on the absorption spectrum of the molecule—e.g., the algorithm may not know the precise frequency of the laser. To identify a particular absorption line (e.g., the primary or a backup absorption line), the peak detection algorithm may first identify a particular manifold that is close to the lasing mode (or current frequency) of the spectroscopy laser. In one embodiment, the peak detection algorithm uses a machine learning (ML) algorithm to identify a location of the laser on the absorption spectrum of the molecule by identifying the manifolds. That is, the ML algorithm can receive a scan performed by the spectroscopy laser and identify one (or more) of the manifolds in the scan using one or more ML models. Put differently, because the manifolds in an absorption spectrum are unique, an ML algorithm can be trained to identify a particular manifold, and thus, identify the current location of the laser on the absorption spectrum. With the known location, the peak detection algorithm can adjust the laser to move its lasing mode to a manifold that includes the preferred absorption line. If the laser cannot reach that manifold, the peak detection algorithm can adjust the laser to move the lasing mode to a manifold that includes one of the backup absorption lines as discussed above.

In another embodiment, the peak detection algorithm uses a frequency comb in the system to identify a location of the laser on the absorption spectrum. For example, by shifting the frequency comb parameters the peak detection algorithm can determine which comb tooth is closer to the frequency of the spectroscopy laser, which provides an estimate of the absolute frequency location of the spectroscopy laser. This location can then be used by the peak detection algorithm to tune the spectroscopy laser to the preferred (or a backup) absorption line.

In another embodiment, the peak detection algorithm can use both the ML algorithm and the frequency comb to identify the location of the spectroscopy laser on the absorption spectrum of the atomic reference. For example, the frequency comb can be used to identify a rough frequency of the spectroscopy laser. This can be input to the ML algorithm to narrow its search space to identify a particular manifold. This may improve accuracy relative to using only one of these techniques to identify the location (or frequency) of the spectroscopy laser.

The embodiments below also describe techniques for training the ML algorithm (which may incorporate, e.g., a deep learning-based classification model) to identify manifolds when a spectroscopy laser is scanned. A ML model can be trained using a reference absorption spectrum of the chosen molecule (known as an atlas), spectroscopic data acquired using the spectroscopy laser, or both. To allow the ML model to generalize effectively despite differences between the training data and the spectrum measured by the spectroscopy laser (due to, e.g., a finite signal-to-noise ratio, laser aging effects, or nonlinear tuning behavior of the laser), augmentation of the training dataset can be performed. This augmentation can include adding affine transformations of the "ideal" manifolds, truncated manifolds, and manifolds where relative peak heights of the lines are fluctuated, baseline drifts are added, etc. to the training dataset. Alternatively, the ML algorithm can leverage one or more pre-trained models (e.g., publicly available models provided by a third party) which already have a high degree of generalizability by using transfer learning or fine-tuning the models on the training dataset.

FIG. 1 illustrates a frequency standard 100, according to one embodiment described herein. The frequency standard 100 includes a spectroscopy laser 110 that is used to lock or stabilize a frequency comb 120. In one embodiment, the frequency comb 120 repetition rate ($F_{REP}$) is stabilized by locking the frequency of the carrier-envelope offset (CEO) ($F_{CEO}$), and the frequency of a single comb tooth. One stabilization strategy for $F_{CEO}$ locking is self-referencing where a beatnote is generated between one comb tooth on the lower frequency end of the spectrum that is then frequency doubled along with another comb tooth on the high frequency end, assuming the spectrum covers an optical octave. Such a broad spectrum can be achieved using supercontinuum generation. Once the comb 120 is self-referenced, the repetition rate can be stabilized by locking a comb tooth to the spectroscopy laser 110 using an optical beatnote ($F_{OPT}$) between the two systems.

The output of the frequency comb 120 can be used to generate a very accurate clock output 125. This clock output 125 may be an electronic signal (rather than optical signal) that can be used as part of an atomic clock.

In addition, the frequency standard 100 also includes a peak identification system 105 to lock the spectroscopy laser 110 to an atomic reference 115. In one embodiment, the spectroscopy laser 110 is stabilized using a spectroscopy technique that precisely aligns the spectroscopy laser 110 to a known frequency using the atomic reference 115 (e.g., an atomic vapor cell). That way, aligning the frequency comb 120 to the spectroscopy laser 110 ensures the teeth of the frequency comb 120 have a known frequency.

In one embodiment, the peak identification system 105 locks the spectroscopy laser 110 to an absorption line of the atom or molecule in the atomic reference 115. The absorption line can also be referred to as a reference line or a resonance line. For example, a spectroscopy technique can be used where the spectroscopy laser 110 is introduced into the atomic reference 115 (e.g., a vapor cell). The peak identification system 105 can adjust the frequency/wavelength of the spectroscopy laser 110 and measure the light absorption (or similarly resulting fluorescence). That is, light absorption can be measured while changing the wavelength of the spectroscopy laser 110 being transmitted through the atomic reference 115 which results in a peak or a series of peaks. These peaks correspond to the absorption lines of the vapor. However, the definition of the peak can vary based on the type of spectroscopy being implemented. At a peak, the optical signal is absorbed by the vapor in the atomic reference 115 while at other wavelengths, the optical signal passes through the atomic reference 115 with minimal absorption.

The embodiments herein are not limited to any particular type of spectroscopy technique. For example, the embodiments herein can be used with Frequency Modulation Spectroscopy (FMS), modulation transfer spectroscopy (MTS), and the like.

The particular molecule or atom used in the atomic reference 115 can vary depending on the wavelength of the spectroscopy laser 110. As an example, the spectroscopy laser 110 may be a diode pumped solid state (DPSS) laser. Iodine has reference lines throughout the DPSS lasing wavelength region (e.g. 532 nm), allowing useful operation at many possible DPSS laser output wavelengths. However, embodiments herein are not limited to any particular type of spectroscopy laser 110 or atomic reference 115, or wavelength. For example, 632 nm iodine lines are commonly used for length standards. Some other suitable types of spectroscopy lasers include semiconductor lasers (distributed-feedback (DFB) laser, distributed Bragg reflector (DBR) laser, or external cavity diode lasers (ECDLs)) and Fiber lasers. The molecule used as the atomic reference 115 can depend on the wavelength of the spectroscopy laser 110 being used, but suitable molecules can include iodine, acetylene, methane, etc.

As explained in more detail below, the spectroscopy laser may not be able to lock to a preferred absorption line of the vapor in the atomic reference. As such, the peak identification system 105 may try to lock the laser to one or more backup absorption lines of the vapor. While the vapor in the atomic reference 115 may be a single atomic species, single atomic species typically do not exhibit an absorption spectrum with multiple absorption lines within a gain region of a laser. That is, an atom may have multiple absorption lines, but they may be spread out over a wide range of frequencies such that at most one or two absorption lines are within the gain region of laser. As such, it may be preferred to use a molecule which can have many absorption lines (and several manifolds, or groupings of absorption lines due to its rovibronic structure) within the expected gain region of a laser. Thus, although atoms can be used, a molecule may be preferred over an atom since it often provides more candidate absorption lines.

In one embodiment, the peak identification system 105 is a computing device or computing system that includes a processor and memory. In one embodiment, the peak identification system 105 is an embedded computing device within a package that includes the frequency reference 100. In another embodiment, the peak identification system 105 may be a separate computing device that is not included within the same packaging that includes the frequency comb 120, the spectroscopy laser 110, and the atomic reference 115. The peak identification system 105 can include software or firmware for performing the functions described herein.

Figure 2A:
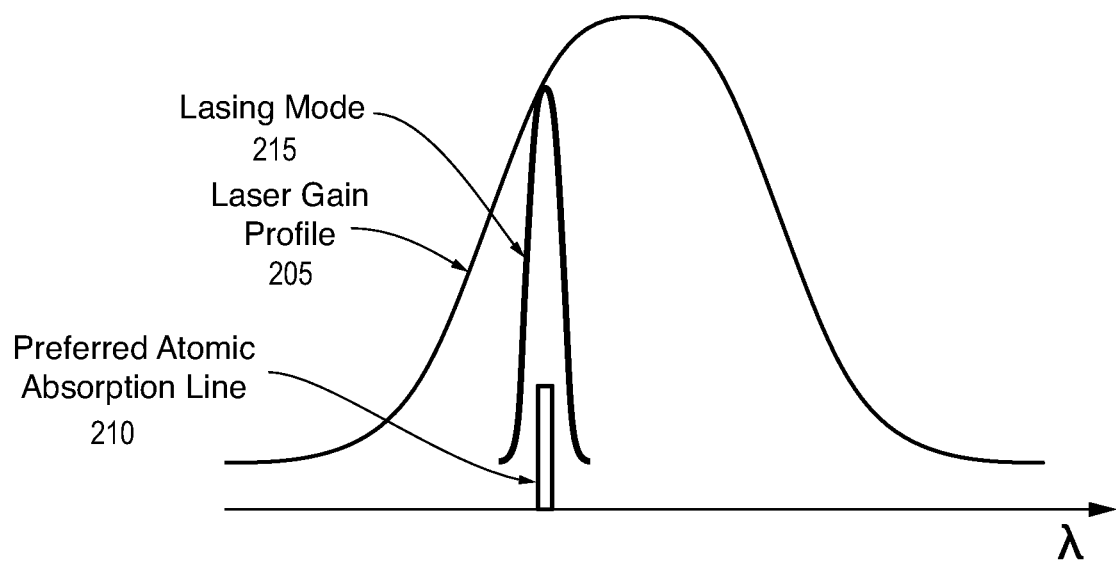
FIGS. 2A-2E illustrate relationships between laser gain profiles and absorption lines, according to one embodiment described herein.

FIGS. 2A-2E illustrate relationships between laser gain profiles and absorption lines, according to one embodiment described herein. FIG. 2A illustrates an ideal scenario where a target atomic absorption line 210 falls within a gain profile 205 of a spectroscopy laser. The gain profile 205 illustrates a wavelength or frequency range where the spectroscopy laser (e.g., the spectroscopy laser 110 in FIG. 1) can operate. For example, the gain profile 205 can indicate a range of wavelengths where the peak identification system can move the lasing mode 215 wavelength of the spectroscopy laser. The lasing mode can be adjusted using laser current, temperature, or other actuators built into the laser (e.g. a piezoelectric transducer) in any combination.

Using a spectroscopy technique, the peak identification system can move the lasing mode 215 so it matches (or overlaps) the preferred atomic absorption line 210. As such, the peak identification system knows the precise wavelength or frequency of the spectroscopy laser so it can then be used to accurately stabilize the frequency comb as discussed in FIG. 1.

Figure 2B:
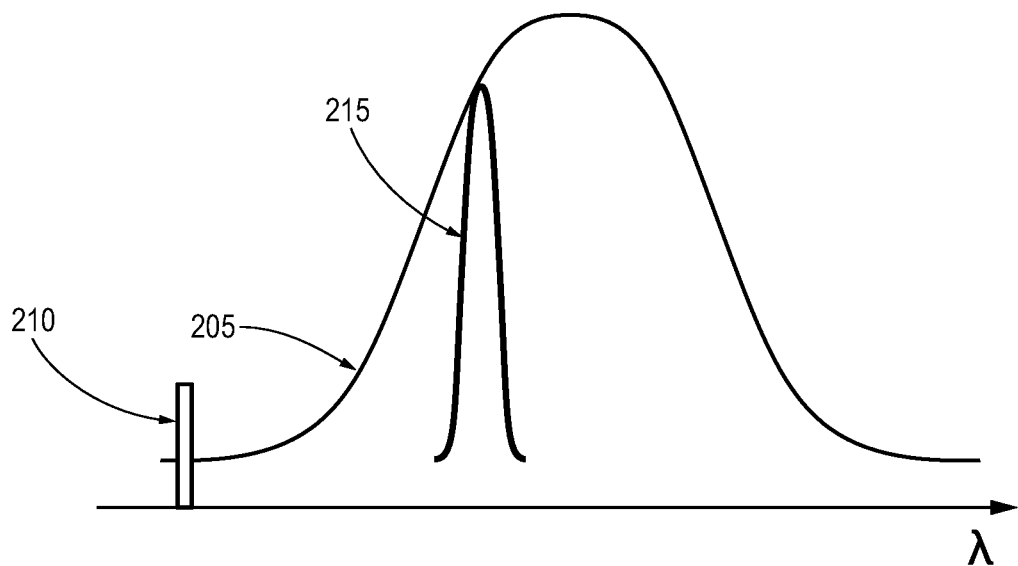

FIG. 2B illustrates a non-ideal scenario where the target absorption line 210 falls outside the gain profile 205 of the spectroscopy laser. As such, the peak identification system is unable to move the lasing mode 215 of the spectroscopy laser to match or overlap the line 210. In that case, the spectroscopy laser cannot be used since it can never be operated to ensure it has the same frequency or wavelength as the absorption line 210.

The non-ideal scenario illustrated in FIG. 2B can arise from fabrication defects or variations when fabricating the spectroscopy laser. For example, the spectroscopy lasers may be fabricated on a larger wafer, where hundreds or thousands of lasers are fabricated in parallel. Due to fabrication defects or variations, the lasers may have different gain profiles 205. That is, some spectroscopy lasers may have gain profiles 205 that encompass the preferred absorption line 210 as shown in FIG. 2A while others have gain profiles 205 as shown in FIG. 2B that do not. These lasers may be discarded, thereby reducing yield and increasing costs.

However, the embodiments below discuss peak identification algorithms where the lasers with gain profiles 205 that do not encompass the preferred absorption line 210 can still be used in a frequency standard. For example, these lasers may be matched to backup absorption lines that are within their gain profiles 205. Thus, these spectroscopy lasers can still be used and do not have to be discarded.

Figure 2C:
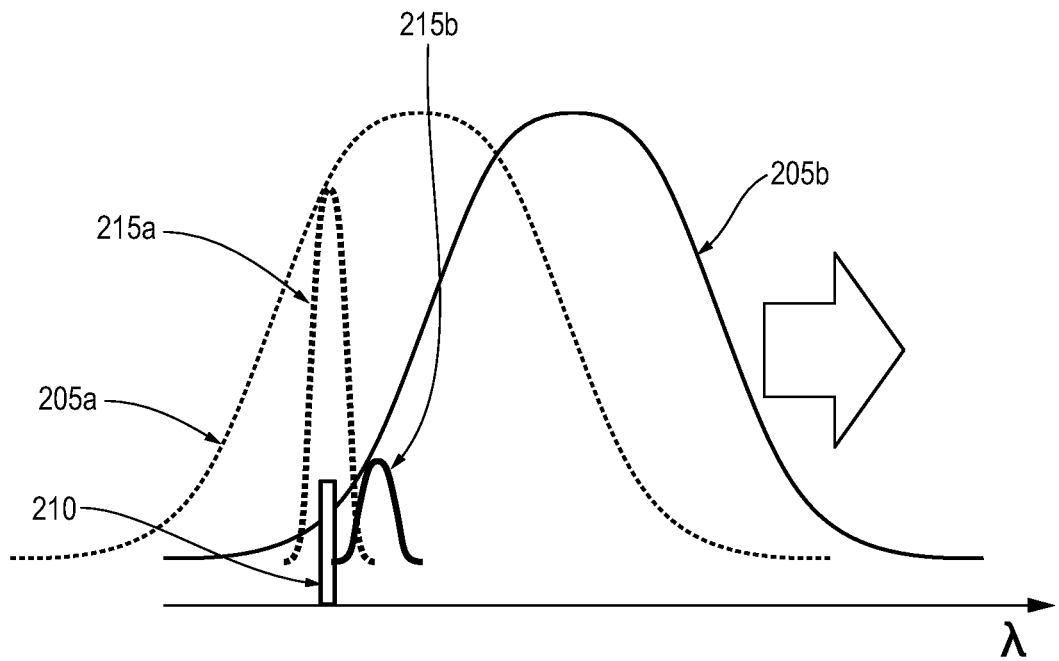

FIG. 2C illustrates another non-ideal scenario where the gain profile 205 of a laser changes. This can be due to aging where over time the gain profile 205 shifts or shrinks in frequency breadth. In this example, the original gain profile 205A shifts to the right over time to form a new gain profile 205B. For example, when the laser was first fabricated and installed in a frequency standard, it may have had the gain profile 205A which includes the preferred absorption line 210. However, over time the gain profile shifted as illustrated by the gain profile 205B such that it no longer includes the preferred absorption line 210. As such, with the gain profile 205A, the peak identification system is able to adjust the lasing mode 215A such that it overlaps the absorption line 210. In contrast, with the gain profile 205B, the peak identification system is unable to move the lasing mode to match the peak absorption line 210. As such, the lasing mode 215B is at a different wavelength or frequency than the peak absorption line 210. In that case, the peak identification system can no longer assume the spectroscopy laser is at a known frequency, and thus, cannot stabilize the frequency comb repetition rate with an accuracy that is sufficient for many atomic clock implementations.

However, the embodiments below discuss peak identification algorithms where the lasers with gain profiles 205 that shift over time can still be used even when the gain profiles 205 no longer contain the preferred absorption lines 210. For example, these lasers may be matched to backup absorption lines that are within the shifted gain profiles 205. This extends the operational lifetime of the clock.

Figure 2D:
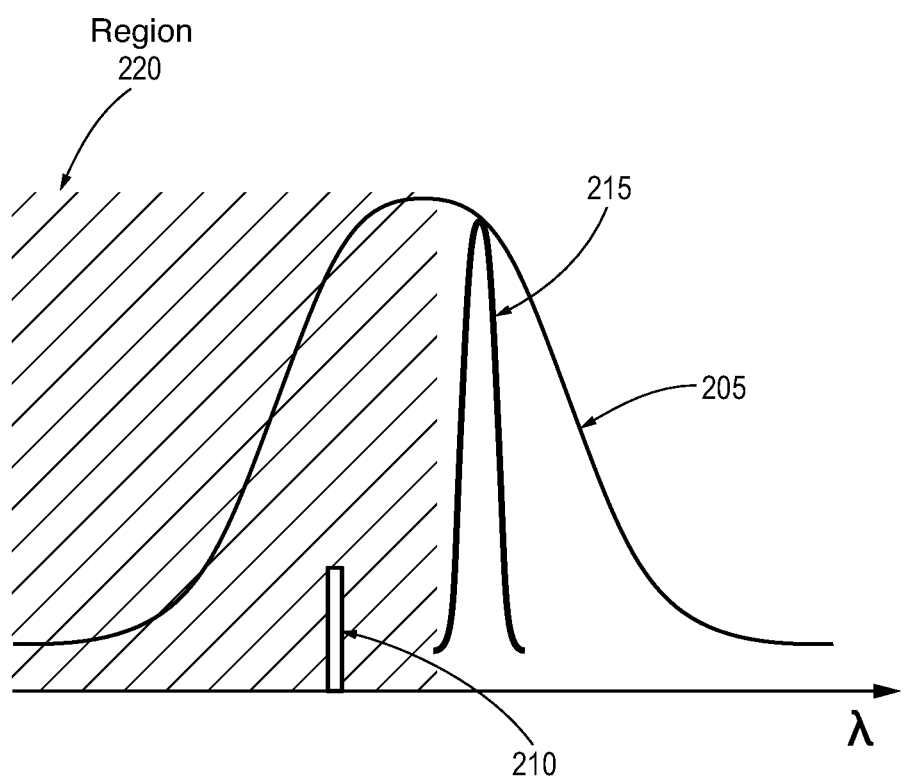

FIG. 2D illustrates another non-ideal scenario where some of the gain profile 205 of a laser is inaccessible. That is, FIG. 2D illustrates an inaccessible region 220 where the peak identification system cannot currently move the lasing mode 215 of the spectroscopy laser. This can be due to an operational challenge such as the current operating environment of the spectroscopy laser (e.g., extreme temperatures or humidity), or limitations in allowed adjustments set by other sub-systems in the clock, such as a particular temperature environment needed for the atomic reference.

If the preferred absorption line 210 is within the inaccessible region 220, this means the lasing mode 215 cannot be moved to overlap with the absorption line 210. As such, the peak identification system can only move the lasing mode 215 within a portion of the gain profile 205 that is outside the inaccessible region 220. The peak identification system can no longer assume the spectroscopy laser is at a known frequency, and thus, cannot stabilize the frequency comb repetition rate with an accuracy that is sufficient for many atomic clock implementations.

However, the embodiments below discuss peak identification algorithms where lasers currently experiencing environmental conditions that prevent the lasing mode from matching the preferred absorption line 210 can move the lasers to a backup absorption line that is still within the gain profile 205 but outside the inaccessible region 220.

Figure 2E:
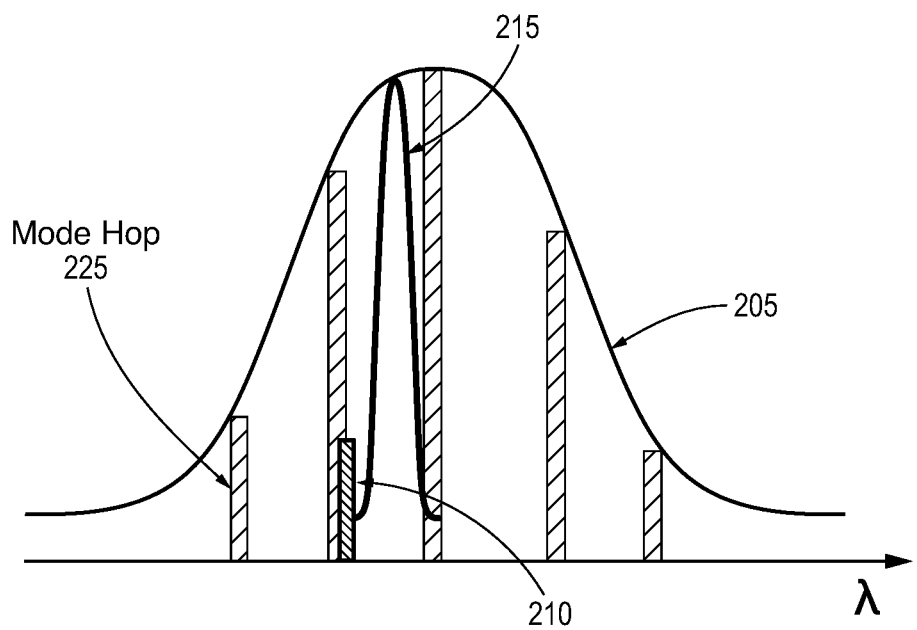

FIG. 2E illustrates another non-ideal scenario where there are mode hops 225 in the gain profile 205. Laser cavity mode hops 225 are narrower bands in the gain profile 205 where the lasing mode 215 cannot be set. That is, as the peak identification system moves the lasing mode 215 towards a mode hop 225, the lasing mode will eventually jump over a forbidden region due to the mode hop 225.

For some lasers, the absorption line 210 may overlap with one of the mode hops 225, which means the lasing mode 215 cannot overlap with the line 210. This scenario is illustrated in FIG. 2E. Further, mode hops can shift or change as the laser ages. Thus, when a laser is first powered on, it may not have a mode hop that includes the preferred absorption line 210, but over time a mode hop can move so that the line 210 falls within a mode hop. In these instances, the peak identification system can no longer assume the spectroscopy laser is at a known frequency, and thus, cannot stabilize the frequency comb repetition rate with an accuracy that is sufficient for many atomic clock implementations.

However, the embodiments below discuss peak identification algorithms where lasers that have a mode hop preventing the lasing mode from matching the preferred absorption line 210 can move the lasers to a backup absorption line that is still within the gain profile 205 but not within a mode hop 225.

Figure 3:
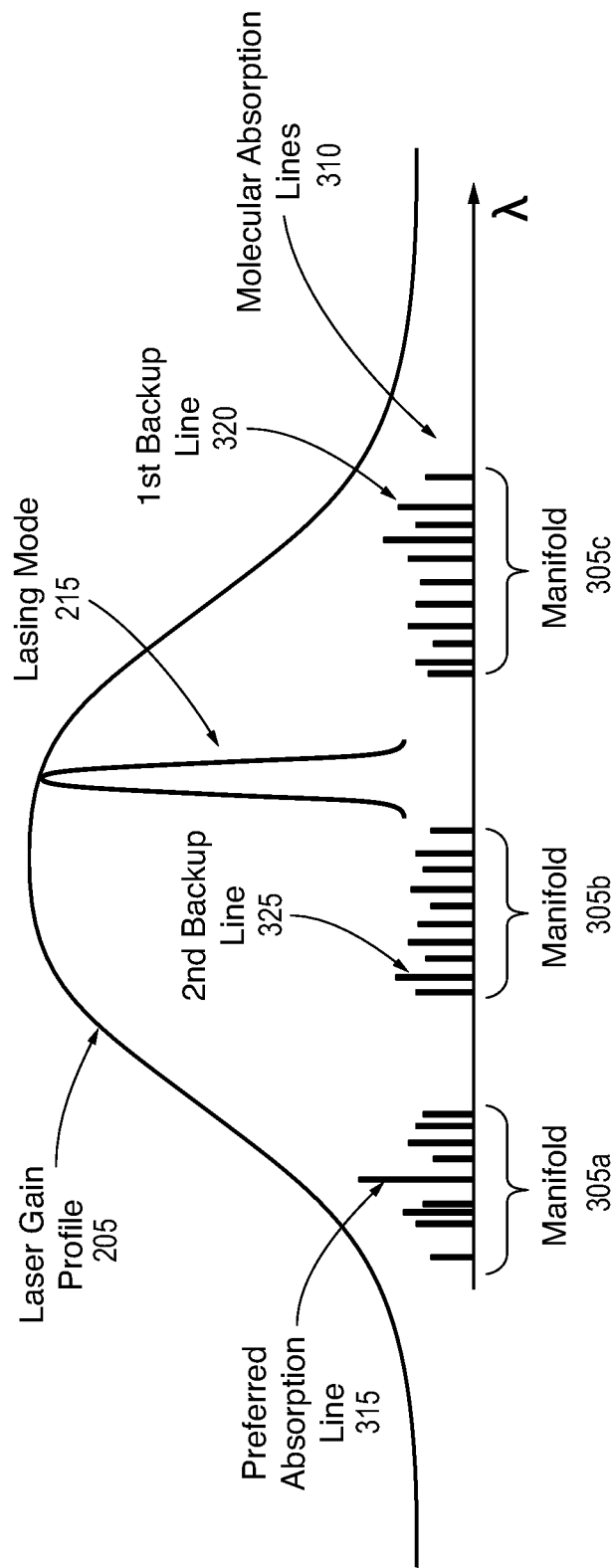
FIG. 3 illustrates multiple molecular reference line manifolds within a gain profile of a spectroscopy laser, according to one embodiment described herein.

FIG. 3 illustrates multiple rovibronic spectral manifolds 305 within a gain profile 205 of a spectroscopy laser, according to one embodiment described herein. For many molecules, the absorption lines 310 in their absorption spectrum are grouped into manifolds 305. These manifolds 305 can be unique with different number of absorption lines 310 where the lines 310 can have different absorption "strengths" (represented by the height of each absorption line 310) and linewidths.

FIG. 3 illustrates three manifolds 305A-C that are in (or close to) the gain profile 205 of the reference/spectroscopy laser. A user or algorithm (e.g., a ML algorithm or model) can select which of the lines 310 make up the set or list of candidate absorption lines that can be used to match with the lasing mode 215 in order to lock the spectroscopy laser to a known frequency. In this case, the preferred absorption line 315 is in the manifold 305A, while a first backup line 320 is in the manifold 305C and the second backup line 325 is in manifold 305B. These candidate absorptions lines may have been selected based on any number of factors such linewidth, signal to noise ratio, absorption strength, sensitivity to environmental effects, the frequency separation between neighboring lines within manifolds, the location within a Doppler profile, the location of the manifold relative to the gain profile of the spectroscopy laser, and the like. For example, it may be desired to ensure that at least one backup absorption line is not in the same manifold as the preferred absorption line 315, or that at least one backup absorption line is in a manifold that has a smaller frequency than the manifold containing the preferred absorption line 315 and another backup absorption line is in a manifold that has a larger frequency than the manifold containing the preferred absorption line 315.

Further, the preferred absorption line may be selected because it has the best profile, or because it has a frequency that is closest to a realized center frequency of the spectroscopy laser, or some weighted combination of these factors. In yet another example, the candidate absorption lines may be selected based on historical or experimental information related to the spectroscopy laser such as the direction (and amount) the gain profile 205 shifts as it ages, the effects that environmental conditions have on the gain profile 205, and variations in the fabrication process. Put differently, the user or algorithm may select the backup absorption lines to be in manifolds that the gain profile 205 is expected to cover in the presence of fabrication variations, aging, fluctuations in environmental conditions, mode hops, and the like. That way, the spectroscopy laser can still be locked to one of the candidate absorption lines using the techniques described below.

Figure 4:
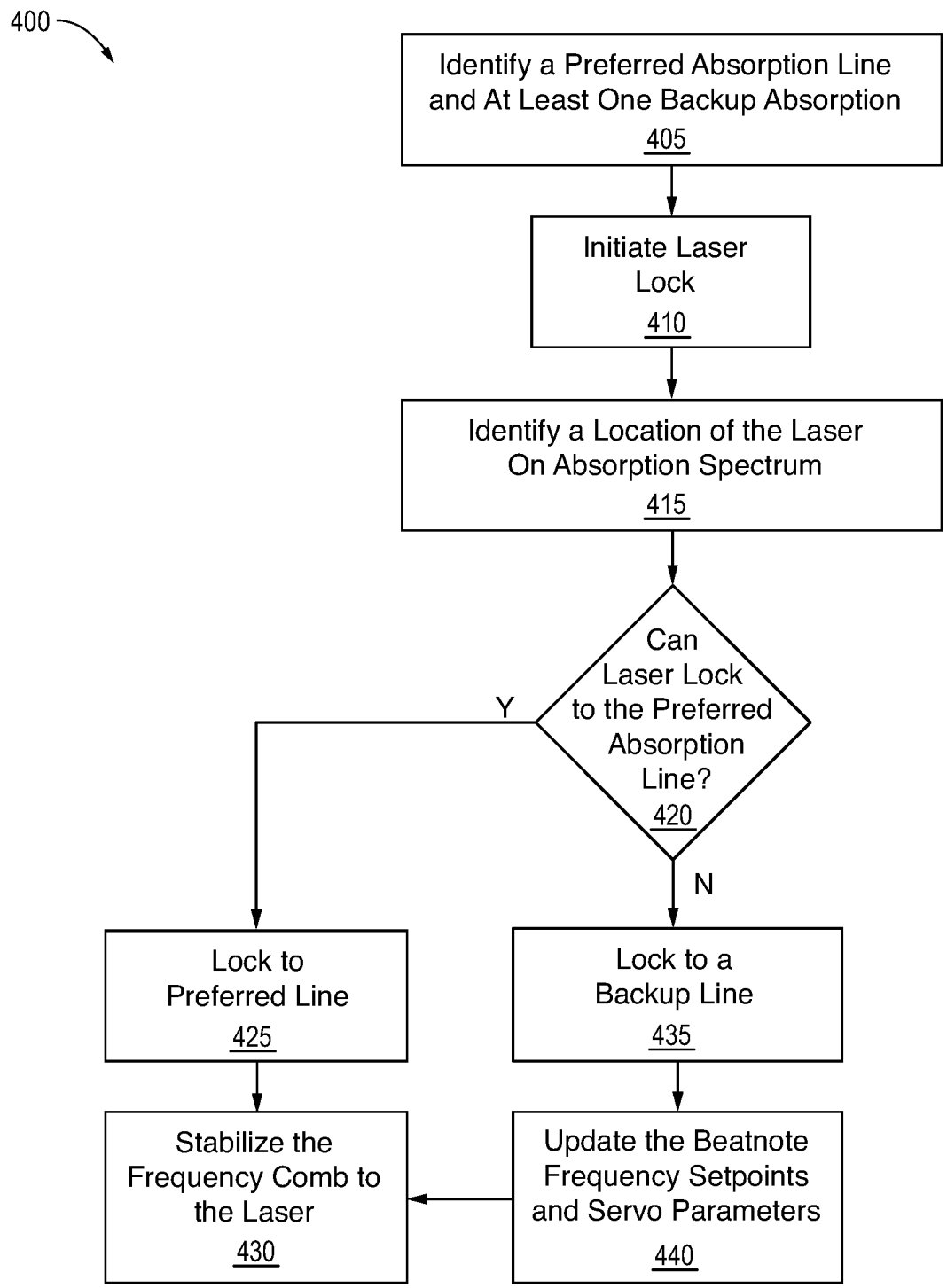
FIG. 4 is a flowchart for locking a spectroscopy laser to one of a plurality of pre-selected absorption lines, according to one embodiment described herein.

FIG. 4 is a flowchart of a method 400 for locking a spectroscopy laser to one of a plurality of pre-selected absorption lines, according to one embodiment described herein. At block 405, a preferred absorption line and at least one backup absorption line are identified. This block may be performed before the spectroscopy laser is first put into operation. For example, in one embodiment, block 405 is performed before the frequency standard containing the spectroscopy laser is shipped to a customer. Thus, the preferred absorption line and at least one backup absorption line (also referred to as candidate absorption lines) can be pre-selected before operation of the spectroscopy laser in a frequency standard. The preferred absorption line and at least one backup absorption line can be stored in a memory (e.g., a lookup table) on the frequency standard.

As discussed below, the experimental parameters used to stabilize the frequency comb to the spectroscopy laser are dependent on the particular absorption line the spectroscopy laser is currently locked to. Thus, the peak identification system may tweak how it stabilizes the frequency comb using the spectroscopy laser depending on which of the candidate absorption lines the spectroscopy laser is currently locked to.

At block 410, the peak identification system initiates a laser lock. This may occur each time the frequency standard is powered on or if a lock is lost due to a disturbance in the system. Further, block 410 may be performed at a predefined interval, or when an operational parameter changes (e.g., a variation in temperature or humidity). In another embodiment, the peak identification system may detect when there is a loss of lock between spectroscopy laser and the current absorption line, and in response, trigger another laser lock at block 410.

Figure 7:
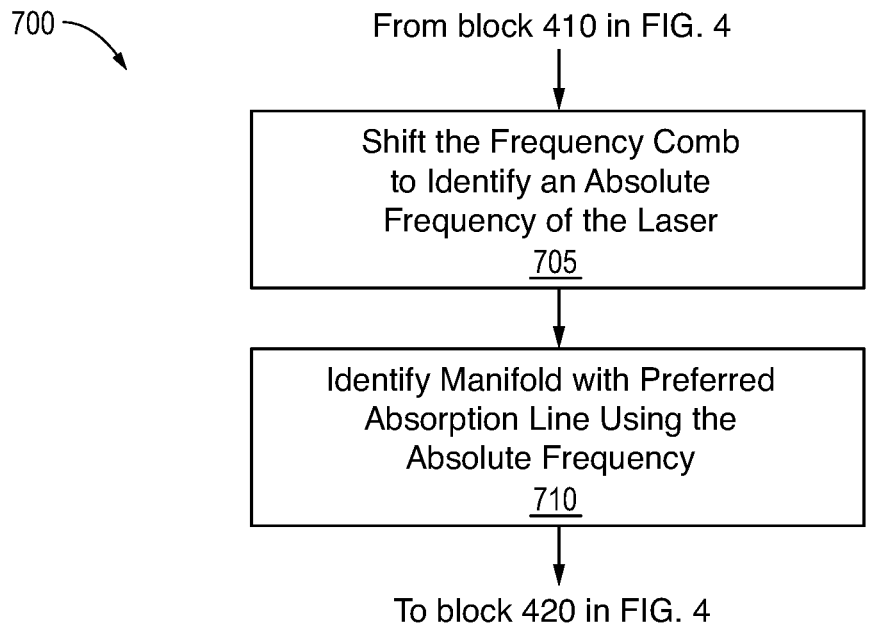
FIG. 7 is a flowchart for using a frequency comb to identify a location of a laser within a molecular spectral manifold, according to one embodiment described herein.

At block 415, the peak identification system identifies a location of the laser on the absorption spectrum (e.g., the spectra) of the atomic reference (e.g., a molecule or atom in a vapor cell). There are various ways for the peak identification system to identify a location of the laser on the absorption spectrum, which are discussed in more detail below. For example, FIG. 5 discusses using a ML algorithm to identify a particular manifold of the absorption spectrum which can then indicate the current frequency of the lasing mode of the spectroscopy laser. FIG. 7 discusses using the frequency comb to identify the frequency of the lasing mode of the spectroscopy laser. Or the peak identification system can use a combination of these techniques to identify the location of the laser in the absorption spectrum of the atomic reference. In general, the method 400 is not limited to any particular technique for discovering the location of the laser (or the frequency of the laser) on the absorption spectrum of the atomic reference. For instance, the peak identification system can use any technique which identifies a particular manifold in the absorption spectrum within the gain region of the laser, or a frequency of the laser.

Once the location of the laser is known in the absorption spectrum of the atomic reference (e.g., by identifying a manifold or a frequency of the laser), at block 420 the peak identification system determines whether the laser can lock to the preferred absorption line. For example, when first turning on the spectroscopy laser, the peak identification system may first attempt to lock the laser to the preferred absorption line.

However, by identifying the location of the laser, the peak identification system may know that the manifold containing the preferred absorption laser is outside of the gain region. Or the peak identification system may know the tuning range of the laser, and given its current location in the absorption spectrum, determine it cannot move the lasing mode to the manifold containing the preferred absorption line. In this case, the peak identification system can determine that it cannot reach the preferred absorption line without having to change the lasing mode of the spectroscopy laser.

In another embodiment, the peak identification system may attempt to move the lasing mode by adjusting laser parameters such as the current used to drive the spectroscopy laser, the temperature of the spectroscopy laser, a mechanical adjuster in a cavity of the laser, etc. The peak identification system can record spectroscopy signals to determine whether the lasing mode of the spectroscopy laser matches the preferred absorption line. However, even if the preferred absorption line is within the gain region, this line may be in a mode hop region of the laser cavity, and thus, the peak identification system may be unable to match the lasing mode to the preferred absorption line, or environmental conditions may prevent the peak identification system from moving the lasing mode to a region of the gain profile that includes the preferred absorption line. In that case, the peak identification system may try to adjust the lasing mode a threshold number of times before reporting a failure to lock the laser to the preferred absorption line.

In one embodiment, assuming the peak identification system is able to adjust the laser parameters to move the lasing mode to the preferred absorption line, the peak identification system may further determine whether the satisfactory performance is achieved when the lasing mode is at the preferred absorption line. For example, the peak identification system can evaluate the signal to noise ratio (SNR), environmental immunity, relative intensity noise (RIN), and the like of the laser to determine whether performance is satisfactory. Thus, even if the lasing mode can be moved to the preferred absorption line, the peak identification system may determine if doing so results in unsatisfactory performance of the spectroscopy laser based on comparing SNR, environmental immunity, RIN, etc. to one or more thresholds. As such, the peak identification system may determine the preferred absorption line is unavailable if the lasing mode cannot be moved to the preferred absorption line, or if the lasing mode can be moved to the preferred absorption line, doing so results in unsatisfactory performance when the lasing mode is at the preferred absorption line.

However, assuming the peak identification system is able to adjust the laser parameters to lock the spectroscopy laser to the preferred absorption line (and doing so provides satisfactory performance), the method 400 proceeds to block 425 where the peak identification system finalizes the lock to the preferred line using a spectroscopy technique (e.g., MTS or FMS).

With the spectroscopy laser now at a known frequency (e.g., the same frequency/wavelength as the preferred absorption line), at block 430 the frequency standard stabilizes the frequency comb to the spectroscopy laser. In one embodiment, the $F_{CEO}$ is stabilized using a self-referencing technique where a beatnote is generated between a frequency doubled lower frequency end of the comb spectrum with a high-frequency end, assuming the spectrum covers an optical octave. Then, the repetition rate $F_{rep}$ of the frequency comb can be stabilized by locking a tooth in the frequency comb to the spectroscopy laser using the optical beat $F_{OPT}$. In one embodiment, the optimization of $F_{REP}$ can include comparison of $F_{REP}$ to an onboard frequency reference such as a quartz or a Micro-electromechanical Systems (MEMS) oscillator.

In this manner, the frequency reference acquires the frequency comb lock. As a result, a digital clocking signal derived from the frequency comb lock is guaranteed to have sufficient accuracy to satisfy an atomic clocking implementation.

Returning to block 420, if for whatever reason the peak identification system was unable to lock the spectroscopy laser to the preferred absorption line, the method 400 proceeds to block 435 where the peak identification system locks the spectroscopy laser to a backup absorption line. In one embodiment, the system may have multiple backup absorption lines, where the peak identification system attempts to lock the laser to the backup absorption lines in a predefined order. In another embodiment, the peak identification system may randomly select a backup absorption line to evaluate after determining it was unable to lock to the preferred absorption line. In either case, if the peak identification system fails to lock the spectroscopy laser to the selected backup absorption line, the peak identification system can select another backup absorption line and repeat blocks 410-420.

Assuming the peak identification system locks the laser to a backup absorption line, at block 440, the peak identification system updates the beatnote frequency setpoints and servo parameters depending on the particular backup absorption line, in order to steer the comb repetition rate $F_{REP}$ to the desired frequency. For example, the peak identification system can store pre-determined $F_{CEO}$ and $F_{OPT}$ beatnote values that correspond to each of the candidate absorption lines. That is, the preferred absorption line can correspond to different $F_{CEO}$ and $F_{OPT}$ beatnote values than the backup absorption lines, and the backup absorption lines can each correspond to different $F_{CEO}$ and $F_{OPT}$ beatnote values. As such, at block 440, the peak identification system selects the $F_{CEO}$ and $F_{OPT}$ beatnote values that correspond to the backup absorption line, rather than using the $F_{CEO}$ and $F_{OPT}$ beatnote values corresponding to the preferred absorption line.

At block 430, the frequency reference stabilizes the frequency comb to the spectroscopy laser using the $F_{CEO}$ and $F_{OPT}$ beatnote values (or setpoint values) that corresponds to the backup absorption line to which the spectroscopy laser was locked.

In this manner, the method 400 illustrates techniques for locking a spectroscopy laser to any number of candidate absorption lines at different frequencies or wavelengths, where the spectroscopy laser can then be used to stabilize a frequency comb using setpoints dependent on the selected candidate absorption line.

While block 440 describes updating the beatnote frequency setpoints and servo parameters depending on the particular backup absorption line, in an alternative embodiment block 440 may be skipped and the method 400 instead proceeds from block 435 directly to block 430 where the frequency comb is stabilized to the laser. In this example, the beat note frequencies are not changed, resulting in a frequency comb repetition rate change. However, the final electronic clock output (e.g., clock output 125 in FIG. 1) may be generated by an adjustable frequency synthesizer (e.g. a fractional n phase locked loop or direct digital synthesis system) which is referenced to the comb repetition rate or a harmonic thereof. When locking to a different candidate absorption line, the frequency synthesizer settings can be adjusted to ensure the final clock output frequency is at the desired value.

Figure 5:
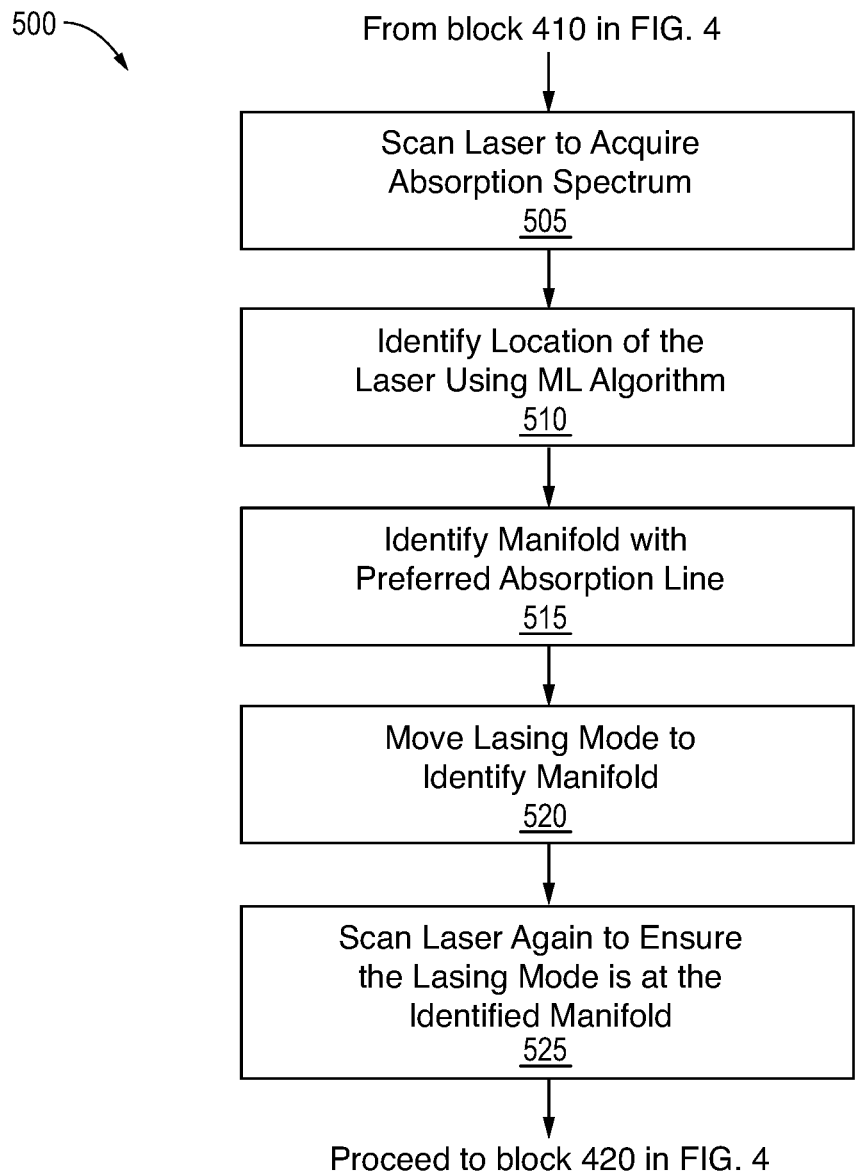
FIG. 5 is a flowchart for using a machine learning algorithm to identify the frequency of a laser within a molecular spectral manifold, according to one embodiment described herein.

FIG. 5 is a flowchart of a method 500 for using a ML algorithm to identify a location of a laser in an absorption spectrum of a molecule, according to one embodiment described herein. In one embodiment, the method 500 is one example of block 415 in method 400 where the spectroscopy laser is scanned to identify a location of the laser on the absorption spectrum of the atomic reference.

At block 505, the peak identification system scans the spectroscopy laser to acquire a portion of the absorption spectrum of the atomic or molecular reference. For example, the peak identification system can use parameters such as current, temperature, or a mechanical actuator to scan the spectroscopy laser frequency across all (or a portion) of its gain profile and measure the absorption spectrum. As shown in FIG. 3, scanning the lasing mode 215 across the gain profile 205 may result in measuring many different absorption lines 310 in multiple different manifolds.

The scan does not have to be across the entire gain profile of the spectroscopy laser, but should be sufficiently wide to scan enough frequencies to cover a manifold (or a substantial portion of a manifold) in the absorption spectrum. The scan need only include enough absorption lines of a manifold so that the ML algorithm can then identify the manifold to which the lines belong.

At block 510, the peak identification system identifies a location of the laser frequency using a ML algorithm. For example, in one embodiment, the ML algorithm includes a manifold identification classifier that can evaluate the absorption lines measured during the scan at block 505 and identify a particular manifold. That is, the classifier can be trained using known manifold data to recognize the unique manifolds in the absorption spectrum of the atomic or molecular reference. Thus, the ML algorithm can receive the signals measured during the scan and identify one or more manifolds in the scan. In this manner, the peak identification system can identify a particular location (e.g., a frequency or range of frequencies) of the spectroscopy laser within the absorption spectrum.

Further, the ML algorithm may be robust enough that it can identify a manifold even if the scan did not include all the absorption lines in that manifold. For example, as discussed in FIG. 6, the ML algorithm can be trained to identify truncated (or cut off) manifolds where not all the absorption lines were detected during the scan performed at block 505.

At block 515, the peak identification system identifies the manifold with the preferred absorption line using the location of the spectroscopy laser in the absorption spectrum. That is, because the entire spectrum of the atomic reference (or at least the relevant portion near the wavelength of the spectroscopy laser) may be known, by identifying one manifold in the spectrum, the peak identification system knows the relative location of the manifold with the preferred absorption line. Put differently, the ML algorithm may need only to identify one manifold from which it can then determine a frequency offset or distance to the manifold containing the preferred absorption line (or to a manifold containing a backup absorption line assuming the peak identification system is unable to lock the spectroscopy laser to the preferred absorption line).

At block 520, the peak identification system moves the lasing mode to the identified manifold that includes the preferred absorption line (or the backup absorption line). As discussed above, the peak identification system can adjust laser parameters such as the current used to drive the spectroscopy laser, the temperature of the spectroscopy laser, a mechanical adjuster in a cavity of the laser, etc. in order to shift the lasing mode to the identified manifold. For example, the peak identification system may have determined a frequency offset between the manifold with the preferred absorption line and the manifold that was identified at block 510 by the ML algorithm. The peak identification system can then adjust the laser parameters to shift the laser frequency by that offset.

In one embodiment, the peak identification system first determines whether it can adjust the laser to move it to the manifold that includes the preferred identification line. For example, depending on the manifold the laser is currently at and known laser current/temp ranges and shifts, the peak identification system may determine it cannot move the spectroscopy laser to the desired manifold with the preferred absorption line. If so, the peak identification system can instead determine whether it can adjust the laser to reach a manifold containing a backup absorption line.

At block 525, the peak identification system performs another (optional) scan with the spectroscopy laser to ensure the lasing mode is at the correct manifold—i.e., the manifold that includes the preferred absorption line. That is, similar to block 505, the peak identification system can move the lasing mode to see if the measured spectroscopy signals match the profile of the manifold with the preferred absorption line. This can be a double check to ensure the ML algorithm made a correct manifold identification at block 510.

The method 500 can then proceed to block 420 to determine whether the spectroscopy laser can lock to the preferred absorption line (or to a backup absorption line). When locking to a specific line in the manifold, the peak identification system can use a different algorithm (besides the ML algorithm) to identify the candidate absorption line within the manifold such as peak finder/counter scheme, wavelet transform scheme, zero crossings on error signals, a different ML algorithm/model, etc. Thus, in this example, the peak identification system can use the ML algorithm to identify a location of the laser frequency on the absorption spectrum (e.g., to identify any one of the manifolds in the absorption spectrum), and after using that location to move the laser to the manifold containing a candidate absorption line, use a different algorithm to identify the candidate absorption line from the other lines within the manifold. However, in another embodiment, the same ML algorithm/model may be used to both identify the location of the laser frequency and move the laser to the manifold containing the candidate absorption line.

Figure 6:
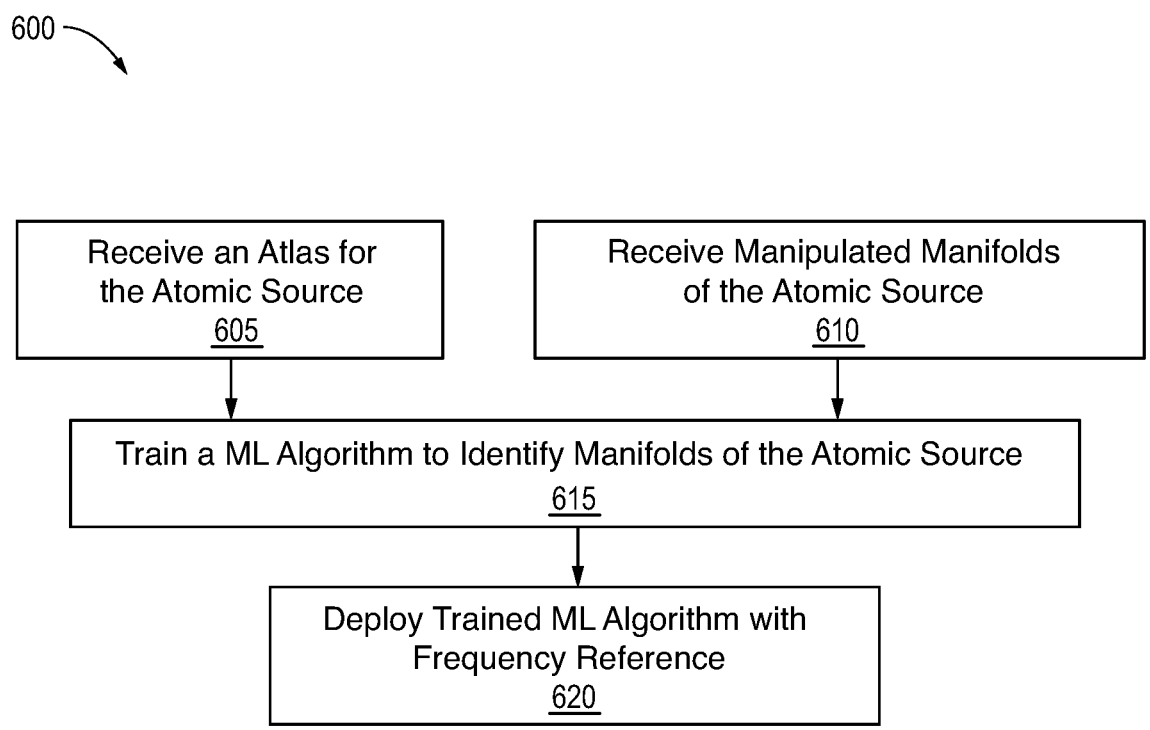
FIG. 6 is a flowchart for training a machine learning algorithm to identify manifolds in the spectra of a molecule, according to one embodiment described herein.

FIG. 6 is a flowchart of a method 600 for training a ML algorithm to identify manifolds in an absorption spectrum of a molecule, according to one embodiment described herein. The method 600 is one example for training the ML algorithm used in FIG. 5 to identify a location of the laser in an absorption spectrum by identifying a manifold in the spectrum.

At block 605, a training application (e.g., a software application) receives an atlas for the atomic reference (e.g., the molecule or atom used in the vapor cell). The atlas can be based on scientific references that identify the manifolds and absorptions lines in the atomic reference. Atlases are well known for many different atomic references that can be used with the embodiments herein, such as iodine, acetylene, methane, etc. The atlas can include "ideal" measurements of the manifolds in the absorption spectrum (or spectra) of the atomic reference.

At block 610, the training application receives manipulated manifolds of the atomic reference. Spectroscopy signals from scanning lasers (as performed in blocks 505 and 525 in FIG. 5) can have variety of imperfections due to drifts in laser frequency or power: the absorption spectrum can be distorted (stretched or compressed), the relative peak heights might fluctuate, baseline drifts, etc. Moreover, edge cases can be challenging, such as if a laser scan ends in the middle of a manifold where the manifold is cut off, making identification difficult. To mitigate the likelihood of misidentifying the scanned manifold, at block 610 the ML algorithm is trained on real laser scans over known absorption manifolds with deliberate manipulations and/or augmentations added to the training set. These manipulations can include distortions (e.g., where the ideal manifold has been stretched, compressed, or subjected to other affine transformations; where relative peaks heights of the lines are fluctuated; where baseline drifts are added; etc.), excess noise, and edge cases (e.g., where the ideal manifold has been cut off or truncated). This trains the ML algorithm (e.g., or a manifold identification classifier in the ML algorithm) to be able to successfully identify manifolds where the scanned manifold may be quite different than the manifolds in the training dataset.

At block 615, the training application trains the ML algorithm (or the classifier in the ML algorithm) to identify manifolds of the molecule or atom in the atomic reference. That is, the training application uses the atlas and the manipulated absorption spectrum as inputs to train the ML algorithm so it can identify the scanned manifolds measured at blocks 510 and 525 in the method 500 during inference.

At block 620, the trained ML algorithm is deployed with the frequency reference. For example, the ML algorithm may be embedded software in the peak identification system in FIG. 1. In another embodiment, the ML algorithm can be executed by a computing device that is separate from the frequency reference 100 in FIG. 1, but is communicatively coupled to the frequency reference 100. In that case, during inference, the frequency reference 100 can transmit the information obtained from scanning the spectroscopy laser to the computing device that executes the ML algorithm and receive an identification of a manifold from the ML algorithm.

FIG. 7 is a flowchart of a method 700 for using a frequency comb to identify a location of a laser in an absorption spectrum of an atomic reference, according to one embodiment described herein. In one embodiment, the method 700 is one example of block 415 in method 400 where the spectroscopy laser is scanned to identify a location of the laser on the absorption spectrum of the atomic reference.

At block 705, the peak identification system adjusts the frequency comb to identify a frequency of the spectroscopy laser. In one embodiment the comb parameters which impact $F_{REP}$ and $F_{CEO}$ can be adjusted to identify the beatnote signs and comb tooth number which presently generates the beatnote signal $F_{OPT}$ between the spectroscopy laser and comb. The mode number and beatnote signs allow calculation of the spectroscopy laser absolute frequency which can be used to determine laser adjustments needed to reach the target or back up absorption lines. In one embodiment an additional oscillator (e.g. Quartz or MEMS oscillator) can directly measure $F_{REP}$ as part of the algorithm used for determining the absolute frequency.

At block 710, the peak identification system identifies the manifold with the preferred absorption line using the absolute frequency. That is, if the peak identification system knows the frequency of the spectroscopy laser with sufficient accuracy, it can then determine the frequency offset between the current, absolute frequency, and the frequency of the manifold that has the preferred absorption line.

The method 700 can then proceed to block 420 of FIG. 4 where the peak identification system uses the frequency offset to attempt to lock the spectroscopy laser to the preferred absorption line. Or the peak identification system may determine that it is impossible to lock the laser to the preferred absorption line and instead attempt to lock the laser to a backup absorption line that may be closer to the absolute frequency of the spectroscopy laser.

Further, in one embodiment, the peak identification system can use a combination of methods 500 and 700 to identify a location of the spectroscopy laser in the absorption spectrum of the atomic reference. For example, the method 700 may be used to provide an estimate of the absolute frequency of the spectroscopy laser, which can then be used to narrow down the possible manifolds (e.g., only the manifolds within a certain span of the absolute frequency) to search for a match. Thus, although the methods 500 and 700 can be used independently, combining the methods 500 and 700 may improve accuracy or decrease search time.

Figure 8:
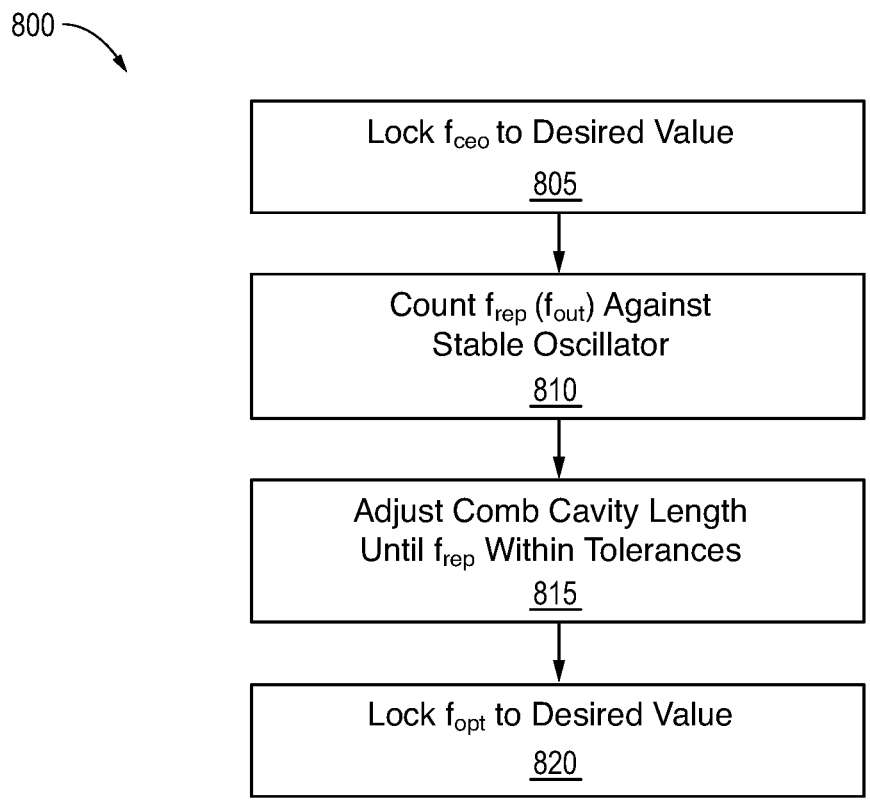
FIG. 8 is a flowchart for adjusting the frequency comb for different absorption lines, according to one embodiment described herein.

FIG. 8 is a flowchart of a method 800 for adjusting the frequency comb to different absorption lines, according to one embodiment described herein. While blocks 430 and 440 in FIG. 4 describe using the spectroscopy laser to stabilize the repetition frequency $F_{REP}$ of the frequency comb, the method 800 describes stabilizing both $F_{REP}$ and $F_{CEO}$ of the frequency comb.

At block 805, the frequency reference locks $F_{CEO}$ to the desired value. For example, this can be performed by self-referencing where a beatnote is generated between a frequency doubled lower frequency end of the comb spectrum with a high-frequency end, assuming the spectrum covers an optical octave. However, the embodiments herein are not limited to any particular type of technique for locking $F_{CEO}$ to the desired value.

Moreover, as mentioned above, the frequency reference can store a pair of pre-determined $F_{CEO}$ and $F_{OPT}$ beatnote values for each of the candidate absorption lines. That is, the $F_{CEO}$ and $F_{OPT}$ beatnote values can change depending on which candidate absorption line the spectroscopy laser was locked to in order to provide a target $F_{REP}$ to the end user.

At block 810, the system compares $F_{REP}$ against a known reference oscillator to evaluate comb operational settings. For example, the reference frequency may use a crystal or MEMS oscillator as a frequency reference to compare with the comb $F_{REP}$ signal.

At block 815, the frequency reference adjusts a cavity length of the frequency comb until $F_{REP}$ is within desired tolerances. As an example, once $F_{REP}$ is within +/−50 Hz of 200 MHz measured by the oscillator, the frequency reference knows that it is at the correct comb tooth.

At block 820, the reference frequency locks FORT to a desired value which stabilizes $F_{REP}$.

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

As will be appreciated by one skilled in the art, the embodiments disclosed herein may be embodied as a system, method, or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function (s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method, comprising:
providing a preferred absorption line and at least one backup absorption line of an atomic reference;
identifying a location of a spectroscopy laser on an absorption spectrum of the atomic reference;
determining using a computing system, based on the location, whether a lasing mode of the spectroscopy laser can be moved to lock the spectroscopy laser to the preferred absorption line; and
upon determining that the preferred absorption line is unavailable, locking the spectroscopy laser to the backup absorption line using a spectroscopy technique.

2. The method of claim 1, wherein identifying the location of the spectroscopy laser on the absorption spectrum comprises:
scanning the spectroscopy laser over a portion of the absorption spectrum of the atomic reference; and
identifying a manifold in the absorption spectrum based on the scan.

3. The method of claim 2, wherein identifying the manifold is performed using a machine learning (ML) algorithm which receives the scan as an input and outputs an identity of the manifold.

4. The method of claim 3, wherein determining whether the lasing mode of the spectroscopy laser can be moved to lock the spectroscopy laser to the preferred absorption line comprises:
determining an offset between the manifold identified by the ML algorithm and a manifold containing the preferred absorption line.

5. The method of claim 1, wherein identifying the location of the spectroscopy laser on the absorption spectrum comprises:
shifting a frequency comb to identify an absolute frequency of the spectroscopy laser.

6. The method of claim 1, wherein determining whether the lasing mode of the spectroscopy laser can be moved to lock the spectroscopy laser to the preferred absorption line comprises:
determining, based on an offset between the location of the spectroscopy laser and a manifold containing the preferred absorption line, whether the lasing mode can be moved to match the preferred absorption line without having to move the lasing mode.

7. The method of claim 1, wherein determining whether the lasing mode of the spectroscopy laser can be moved to lock the spectroscopy laser to the preferred absorption line comprises:
adjusting at least one parameter of the spectroscopy laser to move the lasing mode closer towards a manifold containing the preferred absorption line; and
determining, using the spectroscopy technique, that the lasing mode cannot match the preferred absorption line.

8. The method of claim 1, further comprising:
storing a first pair of carrier-envelope offset frequency ($F_{CEO}$) and optical beatnote frequency ($F_{OPT}$) beatnote values corresponding to the preferred absorption line and a second pair of $F_{CEO}$ and $F_{OPT}$ beatnote values for the backup absorption line; and stabilizing a frequency comb to the spectroscopy laser using the second pair of $F_{CEO}$ and $F_{OPT}$ beatnote values after locking the spectroscopy laser to the backup absorption line.

9. The method of claim 1, wherein the atomic reference comprises a molecule with a plurality of manifolds within a gain profile of the spectroscopy laser.

10. The method of claim 9, wherein the preferred absorption line and the backup absorption line are in different ones of the plurality of manifolds.

11. The method of claim 9, further comprising, after determining the spectroscopy laser can be moved to lock the spectroscopy laser to the preferred absorption line:
   determining whether satisfactory performance is achieved when the lasing mode is moved to the preferred absorption line, wherein the preferred absorption line is unavailable if the lasing mode cannot be moved to the preferred absorption line or when unsatisfactory performance is achieved when the lasing mode is moved to the preferred absorption line.

12. A system, comprising:
   a spectroscopy laser;
   an atomic reference; and
   a peak identification system configured to:
      identify a location of the spectroscopy laser on an absorption spectrum of the atomic reference;
      determine, based on the location, whether a lasing mode of the spectroscopy laser can be moved to lock the spectroscopy laser to a preferred absorption line in the absorption spectrum; and
      upon determining that the preferred absorption line is unavailable, lock the spectroscopy laser to a backup absorption line in the absorption spectrum using a spectroscopy technique.

13. The system of claim 12, wherein identifying the location of the spectroscopy laser on the absorption spectrum comprises:
   scanning the spectroscopy laser over a portion of the absorption spectrum of the atomic reference; and
   identifying a manifold in the absorption spectrum based on the scan.

14. The system of claim 13, wherein identifying the manifold is performed using a machine learning (ML) algorithm which is configured to receive the scan as an input and output an identity of the manifold.

15. The system of claim 14, wherein determining whether the lasing mode of the spectroscopy laser can be moved to lock the spectroscopy laser to the preferred absorption line comprises:
   determining an offset between the manifold identified by the ML algorithm and a manifold containing the preferred absorption line.

16. The system of claim 12, wherein identifying the location of the spectroscopy laser on the absorption spectrum comprises:
   shifting a frequency comb to identify an absolute frequency of the spectroscopy laser.

17. The system of claim 12, wherein determining whether the lasing mode of the spectroscopy laser can be moved to lock the spectroscopy laser to the preferred absorption line comprises:
   determining, based on an offset between the location of the spectroscopy laser and a manifold containing the preferred absorption line, whether the lasing mode can be moved to match the preferred absorption line without having to move the lasing mode.

18. The system of claim 12, wherein determining whether the lasing mode of the spectroscopy laser can be moved to lock the spectroscopy laser to the preferred absorption line comprises:
   adjusting at least one parameter of the spectroscopy laser to move the lasing mode closer towards a manifold containing the preferred absorption line; and determining, using the spectroscopy technique, that the lasing mode cannot match the preferred absorption line.

19. The system of claim 12, wherein the peak identification system is configured to:
   store a first pair of $F_{CEO}$ and $F_{OPT}$ beatnote values corresponding the preferred absorption line and a second pair of $F_{CEO}$ and $F_{OPT}$ beatnote values for the backup absorption line; and
   stabilize a frequency comb to the spectroscopy laser using the second pair of $F_{CEO}$ and $F_{OPT}$ beatnote values after locking the spectroscopy laser to the backup absorption line.

20. The system of claim 12, wherein the atomic reference comprises a molecule with a plurality of manifolds within a gain profile of the spectroscopy laser.

21. The system of claim 20, wherein the preferred absorption line and the backup absorption line are in different ones of the plurality of manifolds.

22. The system of claim 12, further comprising:
   a frequency synthesizer configured to generate a desired output frequency from the repetition rate of a frequency comb stabilized by the spectroscopy laser when the spectroscopy laser is locked to the backup absorption line.

23. A non-transitory computer-readable medium encoding instructions, which, when executed by a processor perform an operation, the operation comprising:
   identifying a location of a spectroscopy laser on an absorption spectrum of an atomic reference;
   determining, based on the location, whether a lasing mode of the spectroscopy laser can be moved to lock the spectroscopy laser to a preferred absorption line in the absorption spectrum; and
   upon determining that the preferred absorption line is unavailable, locking the spectroscopy laser to a backup absorption line in the absorption spectrum using a spectroscopy technique.

* * * * *